(12) United States Patent
Barrett et al.

(10) Patent No.: US 11,994,760 B1
(45) Date of Patent: May 28, 2024

(54) ELECTRONIC DEVICES WITH COHERENT FIBER BUNDLES AND MOLDED POLYMER

(71) Applicant: Apple Inc., Cupertino, CA (US)

(72) Inventors: Daniel J. Barrett, Redwood City, CA (US); Timothy D. Burks, Santa Cruz, CA (US); Tyler R. Kakuda, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 224 days.

(21) Appl. No.: 17/410,454

(22) Filed: Aug. 24, 2021

Related U.S. Application Data

(60) Provisional application No. 63/080,620, filed on Sep. 18, 2020.

(51) Int. Cl.
| | |
|---|---|
| *G02F 1/1333* | (2006.01) |
| *F21V 8/00* | (2006.01) |
| *G02B 6/08* | (2006.01) |
| *G02F 1/01* | (2006.01) |
| *H10K 50/84* | (2023.01) |

(52) U.S. Cl.
CPC ..... *G02F 1/133331* (2021.01); *G02B 6/0005* (2013.01); *G02B 6/08* (2013.01); *G02F 1/0115* (2013.01); *H10K 50/84* (2023.02)

(58) Field of Classification Search
CPC ......... G02F 1/133331; G02F 1/133524; G02B 6/0005; G02B 6/08
See application file for complete search history.

(56) References Cited

U.S. PATENT DOCUMENTS

| | | | |
|---|---|---|---|
| 6,803,144 B2 | 10/2004 | Hovi et al. | |
| 8,976,324 B2* | 3/2015 | Yang | G02F 1/133524 349/158 |
| 9,137,891 B2 | 9/2015 | Gibbs et al. | |
| 9,196,958 B2 | 11/2015 | Arnold et al. | |
| 9,274,369 B1* | 3/2016 | Lee | G02B 6/0005 |
| 10,223,952 B2 | 3/2019 | Powell et al. | |
| 10,579,157 B1 | 3/2020 | Wilson | |
| 10,620,365 B2 | 4/2020 | Dawson | |
| 11,650,368 B1* | 5/2023 | Qiao | G02B 6/08 385/116 |
| 11,737,307 B1* | 8/2023 | Soyseven | H10K 59/00 257/40 |
| 2003/0012532 A1* | 1/2003 | Prigent | H04M 1/0266 362/554 |

(Continued)

*Primary Examiner* — Mariceli Santiago
(74) *Attorney, Agent, or Firm* — Treyz Law Group, P.C.; Tianyi He

(57) ABSTRACT

An electronic device may have a display, a display cover layer, and an image transport layer formed from a coherent fiber bundle. The coherent fiber bundle may be placed between the display and the display cover layer. A gap may separate the coherent fiber bundle from the display cover layer. Adhesive in the gap may attach the coherent fiber bundle to the display cover layer. Molded polymer may be coupled to a bent edge of the display, a portion of the display with backside contacts, or components coupled to the backside contacts or other portions of the display. The molded polymer may support the coherent fiber bundle relative to the cover layer. The molded polymer may be molded to an inner surface of the cover layer and may be used to receive fasteners or otherwise facilitate mounting of housing structures and components in the device.

19 Claims, 6 Drawing Sheets

(56) References Cited

U.S. PATENT DOCUMENTS

| | | |
|---|---|---|
| 2005/0243415 A1 | 11/2005 | Lowe et al. |
| 2011/0025594 A1 | 2/2011 | Watanabe |
| 2015/0243937 A1 | 8/2015 | Dinh et al. |
| 2018/0128973 A1 | 5/2018 | Powell et al. |
| 2019/0391326 A1 | 12/2019 | Yang et al. |

* cited by examiner

ELECTRONIC DEVICES WITH COHERENT FIBER BUNDLES AND MOLDED POLYMER

This application claims the benefit of provisional patent application No. 63/080,620, filed Sep. 18, 2020, which is hereby incorporated by reference herein in its entirety.

FIELD

This relates generally to electronic devices, and, more particularly, to electronic devices that have coherent fiber bundles.

BACKGROUND

Electronic devices may have displays. Displays have arrays of pixels for displaying images for a user. To protect sensitive display structures from damage, displays may be provided with display cover layers.

SUMMARY

An electronic device may have a display, a display cover layer, and an image transport layer formed from a coherent fiber bundle. The coherent fiber bundle may have an input surface that receives an image from the display and a corresponding output surface to which the image is provide through the coherent fiber bundle. The coherent fiber bundle may be placed between the display and the display cover layer and mounted to a housing.

A gap may separate the coherent fiber bundle from the display cover layer. Adhesive in the gap may attach the coherent fiber bundle to the display cover layer. Molded polymer may be used to support the coherent fiber bundle relative to the display cover layer.

The molded polymer may be coupled to a bent edge of the display. This helps protect the bent edge. The presence of the bent edge may help minimize the border of the display.

If desired, the display may have backside contacts and the molded polymer may overlaps parts of the display and circuitry mounted to the backside contacts. In some arrangements, a molded polymer member may be molded to an inner surface of the cover layer. The molded polymer member may have threaded openings or other features to receive fasteners. Fasteners may be used to mount electronic components and other structures to the molded polymer member and/or may be used to attach a housing wall structure to the molded polymer member.

DETAILED DESCRIPTION

An electronic device may have a display. The display may have an array of pixels for creating an image. The image may be visible through transparent structures that overlap the array of pixels. These structures may include an image transport layer such as a coherent fiber bundle. The coherent fiber bundle may have an exposed exterior surface or may be overlapped by a clear display cover layer.

A coherent fiber bundle may be included in an electronic device to help minimize display borders or to otherwise create a desired appearance for a display. The coherent fiber bundle may have an input surface that receives an image from an array of pixels and a corresponding output surface to which the image is transported from the input surface. A layer of glass, polymer, or other clear material may be used to form a display cover layer that protects the output surface. A user viewing the electronic device will view the image from the array of pixels as being located on the output surface.

In configurations in which the input and output surfaces of an image transport layer such as a coherent fiber bundle have different shapes, the image transport layer may be used to warp the image produced by the array of pixels. For example, the shape of the image can be transformed and the effective size of the image can be changed as the image passes through the image transport layer. In some configurations, edge portions of the image can be stretched outwardly to help minimize display borders.

Figure 1:
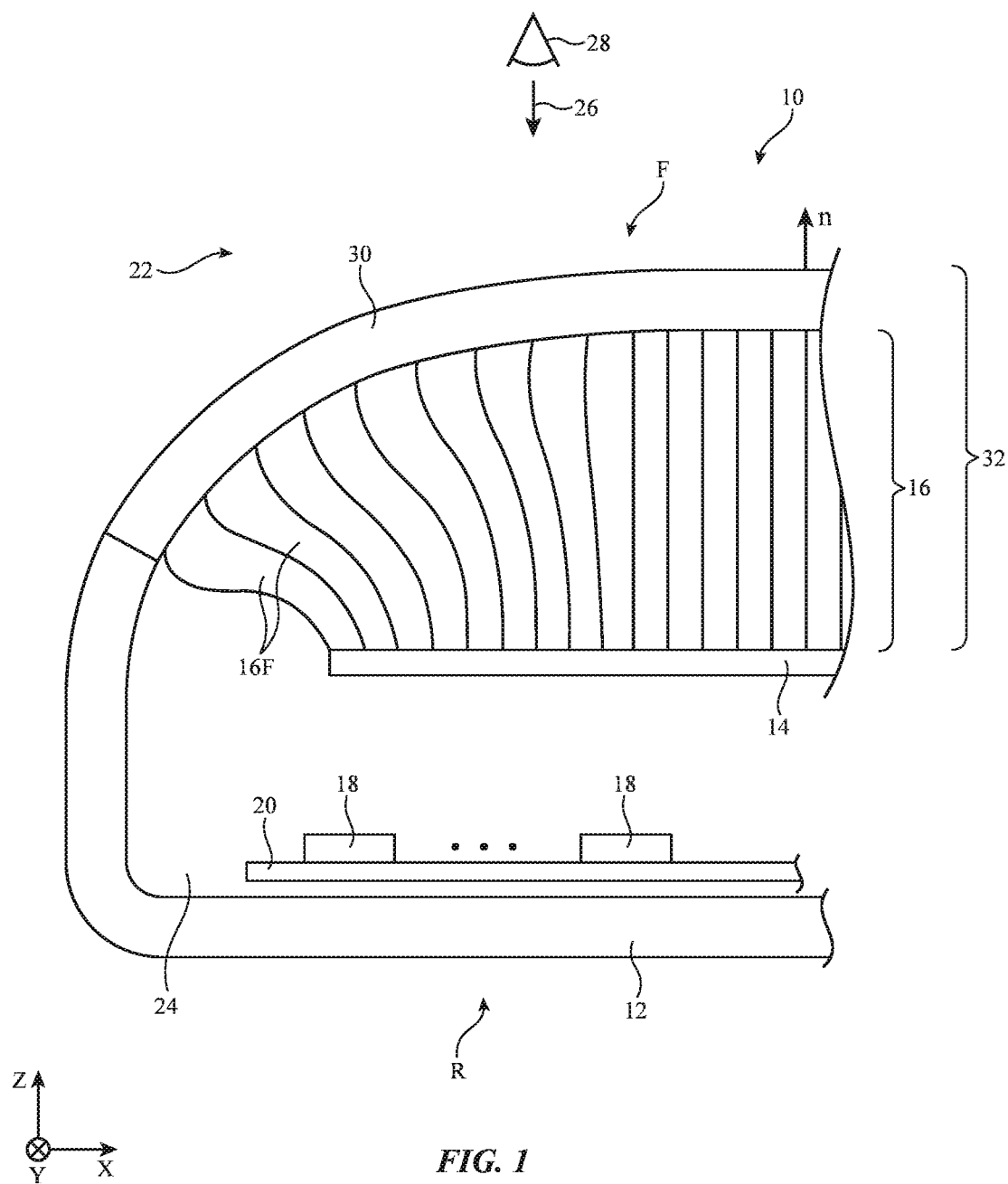
FIG. 1 is a cross-sectional side view of an illustrative electronic device with an image transport layer formed from a coherent fiber bundle in accordance with an embodiment.

A cross-sectional side view of a portion of an illustrative electronic device having a display that includes an image transport layer is shown in FIG. 1. In the example of FIG. 1, device 10 is a portable device such as a cellular telephone, wristwatch, or tablet computer. In general, any type of electronic device may have an image transport layer such as a desktop computer, a voice-control speaker, a television or other non-portable display, a head-mounted device, an embedded system such as a system built into a vehicle or home, an electronic device accessory, and/or other electronic equipment.

Device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions such as interior region 24 and may separate interior region 24 from exterior region 22. For example, housing 12 may have a rear housing wall on rear face R and this rear housing wall may separate interior region 24 from exterior region 22. In some configurations, an opening may be formed in housing 12 for a data port, a power port, to accommodate audio components, or to accommodate other devices. Clear housing regions may be used to form optical component windows. Dielectric housing structures may be used to form radio-transparent areas for antennas and wireless power components.

Electrical components 18 may be mounted in interior region 24. Electrical components 18 may include integrated circuits, discrete components, light-emitting components, sensors, and/or other circuits and may, if desired, be interconnected using signal paths in one or more printed circuits such as printed circuit 20. If desired, one or more portions of the housing walls may be transparent (e.g., so that light associated with an image on a display or other light-emitting or light-detecting component can pass between interior region 24 and exterior region 22).

Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 (e.g., components 18) may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14. The displays may, for example, include an organic light-emitting diode display, a liquid crystal display, a display having an array of pixels formed from respective light-emitting diodes (e.g., a pixel array having pixels with light-emitting diodes formed from respective crystalline light-emitting diode dies such as micro-light-emitting diode dies), and/or other displays. The displays may include rigid display structures and/or may be flexible displays. For example, a light-emitting diode display may have a polymer substrate that is sufficiently flexible to be bent. Display 14 may have a rectangular pixel array or a pixel array of another shape for displaying images for a user and may therefore sometimes be referred to as a pixel array. Display 14 may also sometimes be referred to as a display panel, display layer, pixel layer, pixel array, or pixel array layer. Each pixel array in device 10 may be mounted under a transparent housing structure (sometimes referred to as a transparent display cover layer, protective cover layer structures, etc.).

In the example of FIG. 1, display (pixel array) 14 is mounted under protective layer(s) 32. Layer 32 (which may be considered to form a portion of the housing of device 10), covers front face F of device 10. Configurations in which opposing rear face R of device 10 and/or sidewall portions of device 10 have transparent structures covering displays and other optical components may also be used.

As shown in FIG. 1, layer 32 may include image transport layer 16 and display cover layer 30. Display cover layer 30 serves as a protective outer layer for device 10 and display 14. Display cover layer 30 may be formed from a layer of glass, clear polymer, crystalline material such as sapphire or other crystalline material, and/or other transparent material. The presence of layer 30 may help protect the outer surface of layer 16 from scratches. If desired, layer 30 may be omitted and layer 16 may serve as a protective display cover layer (e.g., in configurations in which a thin-film protective coating is present on the outer surface of layer 16, in configurations in which layer 16 is formed from hard material such as glass, and/or in other configurations in which layer 16 is resistant to scratching). Adhesive and/or other materials may be formed between layer 30 and image transport layer 16 and/or may be included elsewhere in the stack of layers on display 14.

During operation, the pixels of display 14 produce image light that passes through image transport layer 16 (sometimes referred to as an image transfer layer). Optical fibers 16F may form a coherent fiber bundle for image transport layer 16. Each fiber may have a core surrounded by a cladding and optional additional layers (e.g., additional material binding clad fibers together, stray-light absorbing material, etc.). The core, cladding, and/or other materials of layer 16 may be glass materials, polymer materials, and/or other suitable materials. Illustrative configurations in which fibers 16F are formed from fiber cores that are covered with a lower-refractive index cladding to promote light guiding in accordance with the principal of total internal reflection may sometimes be described herein as an example. In general, layer 16 may be formed from any suitable coherent fiber bundle structures.

The fibers or other optical structures of image transport layer structures such as image transport layer 16 transport (transfer) light (e.g., image light and/or other light) from one surface (e.g., an input surface of layer 16 that faces display 14) to another (e.g., an output surface of layer 16 that faces viewer 28, who is viewing device 10 in direction 26). As the image presented to the input surface of layer 16 is transported to the output surface of layer 16, the integrity of the image light is preserved. This allows an image produced by an array of pixels to be transferred from an input surface of a first shape at a first location to an output surface with a different shape (e.g., a shape with a footprint that differs from that of the input surface, a shape with a curved cross-sectional profile, a shape with a surface area of compound curvature, and/or a shape with other desired features).

Image transport layer 16 may therefore move the location of an image and may optionally change the shape of the surface on which the image is presented. In effect, viewer 28 will view the image from display 14 as if the image were generated on the output surface of image transport layer 16. In arrangements in which the image from display 14 is warped (geometrically distorted) by image transport layer 16, digital pre-distortion techniques or other compensation techniques may be used to ensure that the final image viewed on the output surface of image transport layer 16 has a desired appearance. For example, the image on display 14 may be prewarped so that this prewarped image is warped by an equal and opposite amount upon passing through layer 16. In this way, the prewarped image is effectively unwarped by passage through layer 16 and will not appear distorted on the output surface.

In configurations of the type shown in FIG. 1, device 10 may have four peripheral edges and a rectangular footprint when viewed in direction 26 or may have other suitable shapes (e.g., a circular outline when viewed in direction 26). To help minimize the size of inactive display borders as a user is viewing front face F of device 10 as shown in FIG. 1, the shapes of fibers 16F along the periphery of layer 16 may be deformed outwardly as shown in FIG. 1. This type of fiber shape may be formed by deforming a bundle of fibers under pressure in a heated mold. Following deformation in the mold, fibers 16F along the edge of the fiber bundle may each have an outwardly bent segment that bends away from surface normal n of the center of layer 30 (e.g., away from an axis parallel to the Z axis of FIG. 1) and may each have an inwardly bent segment that bends back towards surface normal n to help direct output light towards viewer 28.

The deformed shapes of fibers 16F (e.g., the bends in fibers 16F along their lengths) may help distribute image light laterally outwards in the X-Y plane so that the effective size of display 14 is enlarged and the image produced by display 14 covers some or all of the sidewalls of housing 12 or other peripheral portions of device 10 when the image on front face F is being viewed by viewer 28. For example, the bent shapes of fibers 16F of FIG. 1 may help shift portion of the displayed image laterally outward in the X-Y plane along the edges and corners of device 10 to block the edges of device 10 (e.g., the periphery of housing 12) from view. This helps make the display of device 10 appear borderless to viewer 28. In some arrangements, the portions of fibers 16F at the outermost surface of layer 16 are oriented parallel or nearly parallel with viewing direction 26 and the Z axis of FIG. 1, which helps ensure that some or all of the light that has passed through layer 16 will travel in the Z direction and be viewable by viewer 28.

To help mount image transport layer 16 and other structures within housing 12, one or more polymer support structures may be provided in device 10. In an illustrative configuration, these polymer structures are formed from a low-pressure molding process (e.g., a low-pressure injection molding process involving liquid polymer molding at a pressure of 25-300 psi, less than 250 psi, less than 200 psi, less than 150 psi, or other low pressure). The polymer material used for the low-pressure molding operations may be hot-melt adhesive such as polyamide or other thermoplastic that exhibits a relatively low viscosity (e.g., less than 4000 centipoise, less than 2000 centipoise, or other low viscosity level) when melted (e.g., when heated to a temperature of 150-300° C., less than 250° C., less than 200° C., or other suitable processing temperature suitable for melting the polymer) or may be other suitable thermoset or thermoplastic material (e.g., epoxy, polyurethane, and/or other polymer materials). In some configurations, liquid polymer may be cured by application of heat and/or light (e.g., ultraviolet light). Polymer material that is injection molded in its liquid state can be overmolded on top of structures in device 10 such as display 14, housing 12, image transport layer 16, and display cover layer 30 (as examples). Optional machining operations (e.g., grinding, cutting, polishing, etc.) may be performed on the molded polymer (sometimes referred to as low-injection-pressure molded polymer), if desired.

Figure 2:
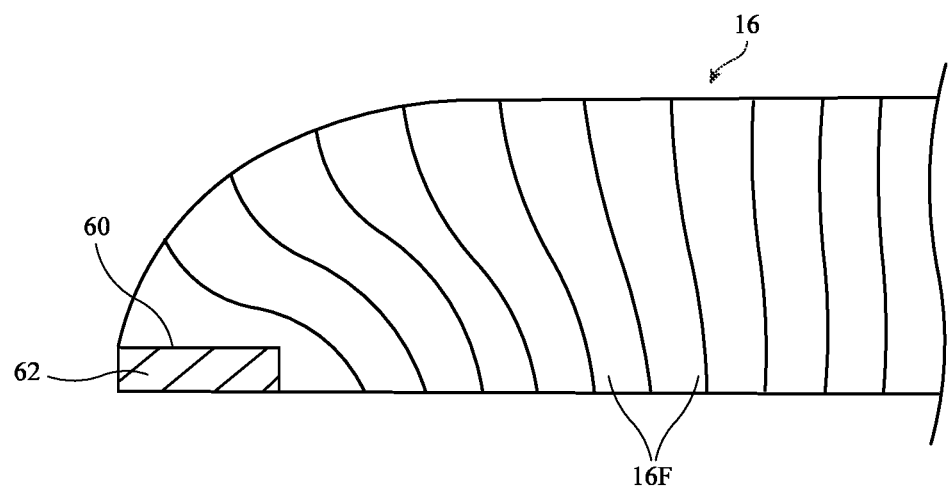
FIG. 2 is a cross-sectional side view of a portion of a coherent fiber bundle having a notch filled with molded polymer in accordance with an embodiment.

Consider, as an example, image transport layer 16 of FIG. 2. As shown in FIG. 2, the process of forming layer 16 under heat and pressure in a mold to bend fibers 16F near the edge of layer 16 may introduce a notch such as notch 60. This notch may be filled with molded polymer (e.g., to planarize the lower surface of layer 16, to help secure layer 16 within device 10, to help facilitate mounting of electrical components and other structures, as part of an encapsulation scheme that secures display 14 and/or other structures, etc.).

In a first illustrative arrangement, low-pressure molded polymer 62 is overmolded onto the edge of layer 16. Machining operations may then be used to planarize and/or otherwise shape the exposed edges of polymer 62, resulting in a desired polymer-filled notch shape and desired overall shape for layer 16. Layer 16 may then be assembled into device 10 with a display and other components.

In a second illustrative arrangement, a display panel such as display 14 of FIG. 1 is attached to the underside of layer 16 prior to injection molding of polymer 62. In this second type of arrangement, the polymer may be molded over a portion of display 14 (e.g., a bent portion) in addition to being molded over notch 60. Following molding, polymer 62 may be machined (e.g., to planarize and/or otherwise shape the exposed surfaces of polymer 62).

Figure 3:
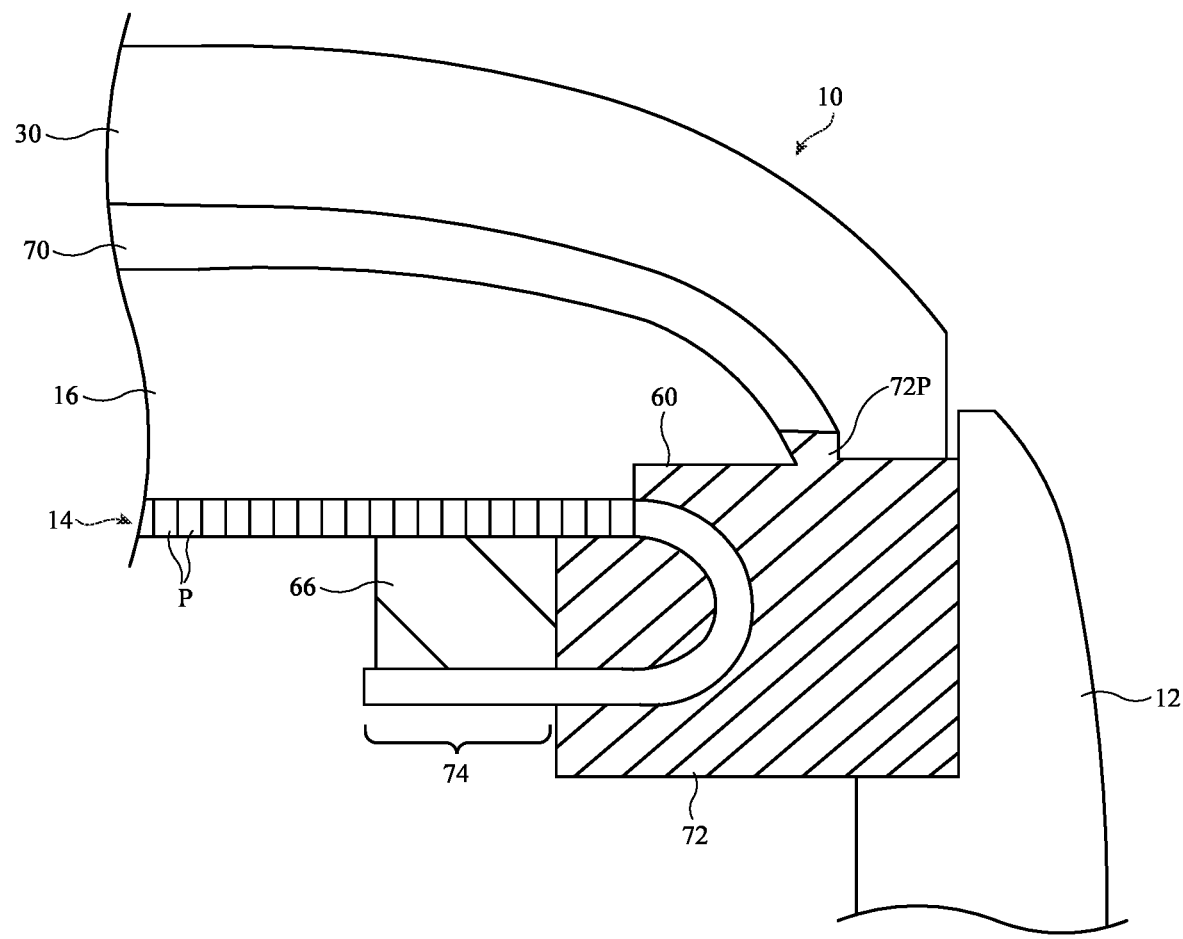
FIG. 3 is a cross-sectional side view of a portion of an electronic device having molded polymer and a coherent fiber bundle overlapping a display in accordance with an embodiment.

FIG. 3 is a cross-sectional side view of a portion of device 10 in an illustrative configuration in which polymer is coupled to layer 16 by molding the polymer over notch 60 and a portion of display 14. The polymer of FIG. 3 may be molded to cover layer 30 and housing 12 and/or the polymer may be attached to layer 30 and/or housing 12 using adhesive or other attachment structures.

In the example of FIG. 3, the active area of display 14 (e.g., the portion of display 14 that contains pixels P that produce an image for viewing by the user) is attached to the input surface of image transport layer 16. The inactive area of display 14 (e.g., the portion of display 14 that includes signal traces, supporting circuitry, encapsulation, and/or other circuitry that does not include pixels P and that does not display images) is bent back on itself to help minimize the border of device 10. A support member such as member 66 (e.g., a polymer member and/or other supporting structure that serves as a spacer) may be attached between regions of the folded-back portion of display 14, thereby helping to establish a desired bend radius for the inactive portion of display 14.

Liquid adhesive 70 (sometimes referred to as liquid optically clear adhesive) may be used to attach image transport layer 16 to display cover layer 30. Ultraviolet light, moisture, heat and/or other curing agents may be used to cure the liquid of adhesive 70 to bond layer 16 and layer 30 together. Following curing, adhesive 70 may be relatively soft, giving rise to the potential for display cover layer 30 to move relative to layer 16 during a drop event or other event in which layer 30 is exposed to excessive stress. To help hold the bent edge of display 14 in a desired bent configuration and to help provide structural support to the connection between layer 16 and layer 30 (e.g., to prevent undesired shifts in position of layer 16 relative to layer 30), polymer 72 (e.g., low-injection-pressure overmolded polymer) may be molded into notch 60, into a peripheral portion of the gap between layer 16 and layer 30, and over the bent portion of display 14.

As shown in FIG. 3, surface 74 of display 14 may be left uncovered so that contacts on this portion of display 14 may be joined to flexible printed circuits or other printed circuits (see, e.g., printed circuit 20 of FIG. 1), may be joined to a connector (e.g., a board-to-board connector or other connector), may be joined to an integrated circuit (e.g., a display driver integrated circuit), and/or may be coupled to other components and circuitry in device 10.

Molded polymer 72 may be molded to a surface of housing 12 to attach housing 12 to polymer 72 or molded polymer 72 may be machined and subsequently attached to housing 12 using adhesive, screws or other fasteners, press-fit connections, and/or other housing attachment structures. During a drop event or other unexpected stress on device 10, portion 72P of molded polymer 72, which protrudes into the gap between layer 16 and layer 30, and other portions of polymer 72 that are molded to layer 16 and layer 30 may help prevent undesired movement between layer 30 and layer 16. The portion of polymer 72 that surrounds the bent end of display 14 may likewise protect display 14 from damage. Polymer 72 may also form a structural support to which housing 12 and/or other structures can be attached, thereby helping to secure display 14, image transport layer 16, and cover layer 30 in desired positions relative to housing 12.

Figure 4:
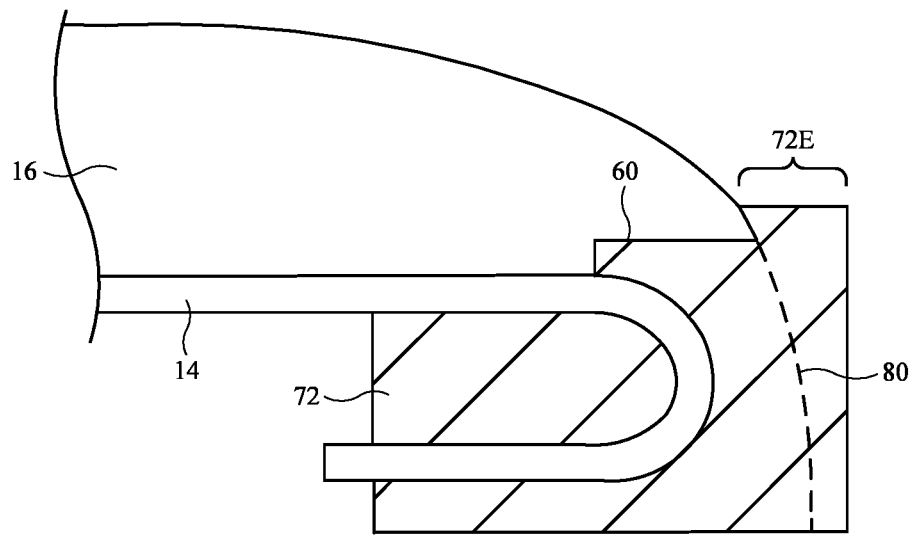
FIG. 4 is a cross-sectional side view of a portion of an illustrative electronic device in accordance with an embodiment.

If desired, polymer 72 may be machined or otherwise shaped following molding (e.g., following molded over notch 60 in image transport layer 16 and/or the bent edge of display 14 or other structures). As shown in FIG. 4, for example, polymer 72 may initially be molded to form a larger member that covers the bent edge portion of display 14 and that fills notch 60. To create a desired exterior surface for part of device 10 and/or to form a surface for the support member formed from polymer 72 to which housing 12 or other structures may be attached, polymer 72 may be machined (e.g., using a grinding tool and/or other machining tools). Polymer 72 may, as an example, be shaped so that the exterior surface of polymer 72 lies along surface 80 (e.g., so that excess polymer 72E of FIG. 4 is removed). Surface 80 may be curved (e.g., to form part of a curved exterior surface for device 10) or may have a planar shape or other suitable shapes. As an example, surface 80 may be planar to facilitate attachment of surface 80 to a mating planar surface of housing 12 (e.g., by attaching the edge of polymer 72 to a ledge in housing 12). Arrangements in which threaded openings and other features are machined into molded polymer 72 may also be used.

It may be desirable to avoid bends in some or all of the edges of display 14. This may be accomplished, for example, by providing display 14 with backside contacts (e.g., contacts on the lower surface of the display substrate for display 14 of FIG. 1) to which printed circuits and other circuitry may be attached.

Figure 5:
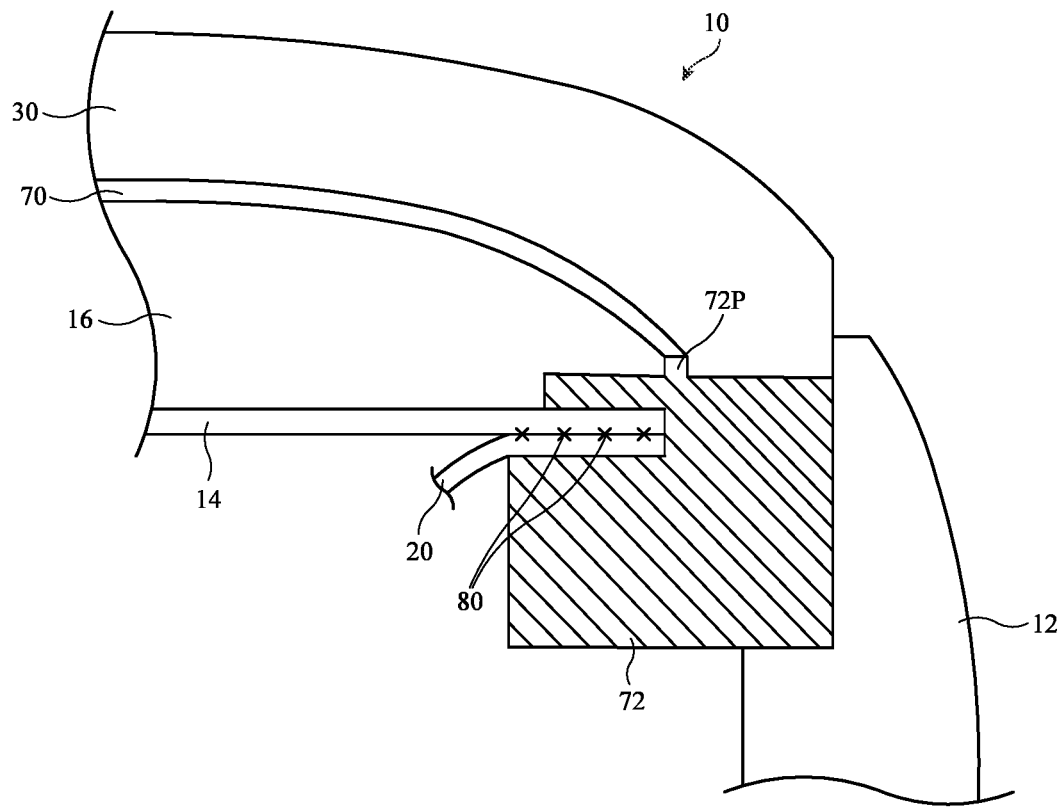
FIG. 5 is a cross-sectional side view of a portion of an illustrative electronic device having a display with backside contacts in accordance with an embodiment.

Consider, as an example, device 10 of FIG. 5. In this example, active area AA of display 14 has pixels that are overlapped by the input surface of image transport layer 16. The pixels emit light for an image from the upper surface of display 14. Backside contacts 80 on the opposing lower surface of display 14 may be formed in the active area of display 14 and/or on the inactive border portion of display 14. These contacts may form solder pads or other contacts to which circuitry (electrical components) can be coupled. As an example, conductive joints may be formed to contacts 80 using solder, conductive adhesive, welds, and/or other conductive connection material.

Any suitable circuitry may be mounted to contacts 80. For example, a display driver integrated circuit or other display control circuitry may be mounted to contacts 80, solder joints and/or conductive adhesive joints may be formed that electrically and physically connect each of contacts 80 to a corresponding contact in printed circuit 20, a connector (e.g., a board-to-board connectors or other connector) may be soldered or otherwise coupled to contacts 80, etc.

Figure 6:
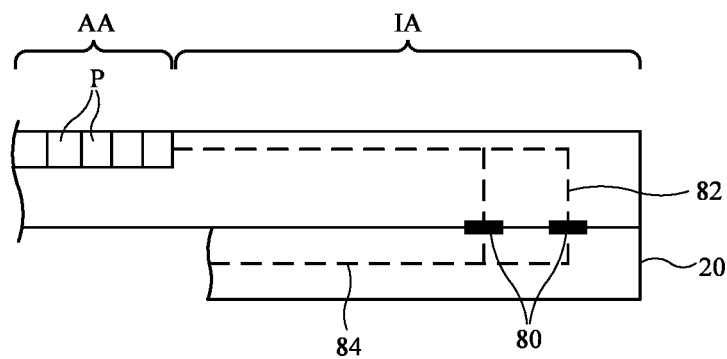
FIG. 6 is a cross-sectional side view of a portion of the display of FIG. 5 in accordance with an embodiment.
Figure 7:
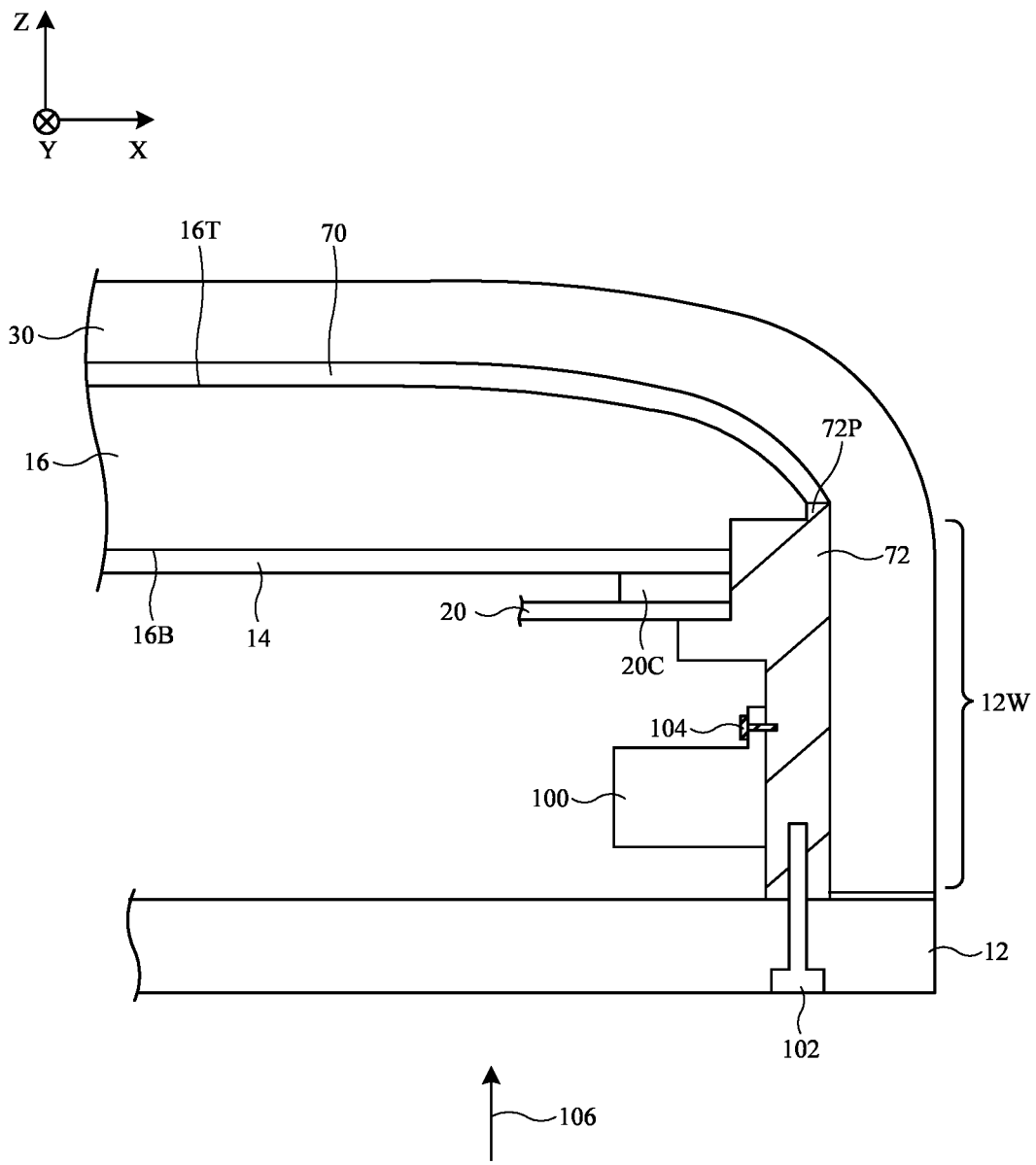
FIG. 7 is a cross-sectional side view of a portion of an illustrative electronic device in accordance with an embodiment.

FIG. 6 is a cross-sectional side view of an illustrative display with backside contacts. In the example of FIG. 6, backside contacts 80 are formed on the backside of display 14 (the lower surface of display 14 that faces away from pixels P) in inactive area IA (a border portion of display 14 that does not contain pixels and that does not display images). Contacts 80 may be formed from vias, rectangular solder pads, and/or other metal traces on the exposed surface of display 14. Circuity that is being mounted to the underside of display 14 such as illustrative printed circuit 20 in the example of FIG. 6 has mating contacts 80. Solder, conductive adhesive, and/or other conductive material may be used to attach and thereby electrically short contacts 80 on display 14 to mating contacts 80 on the circuitry that is being mounted to display 14. This electrically interconnects signal paths 82 (e.g., metal traces) in display 14 to corresponding signals paths 84 (e.g., metal traces) in printed circuit 20 or other circuitry coupled to display 14. If desired, device 10 may have a display cover layer with portions that form housing sidewalls. This type of arrangement is shown in FIG. 7. As shown in FIG. 7, display cover layer 30 may have an upper portion that extends across the front surface of device 10 and that covers output surface 16T of image transport layer 16. Display cover layer 30 may also have a portion that forms some or all of the sidewalls of device 10 such as sidewall portion 12W. Display cover layer 30 may, as an example, be formed from rigid clear polymer or clear glass. Sidewall portion 12W of layer 30 may extend vertically (e.g., downwardly along the –Z dimension of FIG. 7, which is perpendicular to the planar surface of layer 30 on the front of device 10). Sidewall portion 12W may extend around the periphery of display 14. In this configuration, layer 30 forms an open-back glass shell and sidewall portion 12W forms a vertical sidewall that extends in a ring (e.g., a circular or rectangular ring) around the periphery of device 10 (e.g., around the border of display 14 when viewed from the front in the –Z direction of FIG. 7).

During assembly, the components of device 10 may be assembled into the housing shell formed by layer 30. Initially, as an example, display 14 may be attached to input surface 16B of layer 16 (e.g., using adhesive). Display 14 may have a bent edge that is embedded in polymer as described in connection with FIG. 3 or may have backside contacts as described in connection with FIGS. 5 and 6. In an illustrative configuration, which is described herein as an example, display 14 has backside contacts to which integrated circuits, printed circuits, connectors, and/or other circuitry may be attached (see, e.g., component 20C, which may be a display driver integrated circuit, a printed circuit, or a connector).

Component 20C may be, for example, a board-to-board connector connected to the backside contacts of display 14 and printed circuit 20 may be connected to display (pixel layer) 14 using board-to-board connector 20C. Printed circuit 20 may be coupled to other circuitry in device 10 (e.g., control circuitry, sensors and other input-output devices, etc.).

After display 14 has been mounted to image transport layer 16, image transport layer 16 and display 14 may be placed in the open recess formed by display cover layer 30 (e.g., display 14 and layer 16 may be inserted into the open-back shell of display cover layer 30 in direction 106). Adhesive layer 70 may be used to attach layer 16 to layer 30.

Following attachment of layer 16 and display 14 to layer 30, low-injection-pressure molded polymer 72 may be molded onto one or more structures in device 10. For example, polymer 72 may be molded into notch 60 of layer 16, may be molded over the edge of display 14, connector 20C, and/or the edge of printed circuit 20, may be molded onto one or more interior surfaces of sidewall portion 12W or other portions of layer 30, and/or may otherwise be coupled to structures such as these in device 10. Portion 72P of polymer 72 may optionally protrude into the gap between output surface 16T and the opposing inner surface of display cover layer 30 and polymer 72 may otherwise be coupled to image transport layer 16 and display cover layer 30 to help support layer 16 relative to layer 30.

The portions of polymer 72 that are molded onto the inner surface of sidewall portion 12W may be molded or machined so that openings with threads or other engagement structures are formed. These structures may facilitate installation of components into the interior of device 10 and attachment of housing structures to layer 30. For example, a threaded opening may be formed in polymer 72 that is configured to receive fastener 104 when fastener 104 is used in mounting interior device structures such as housing structures and/or electrical components (e.g., component 100) within the interior of device 10. Component 100 may be a sensor, a button, and/or other control circuit or input-output device for device 10. If desired, internal housing structures (e.g., frames, brackets, etc.) may also be attached to polymer 72 using fasteners such as fastener 104. Arrangements in which adhesive, press-fit connections, interlocking clips, and/or other attachment mechanisms are used in mounting housing structures, electrical components, and/or other components (e.g., component 100 of FIG. 7) may also be used. The use of polymer 72 to serve as an attachment point when mounting components into the interior of device 10 may help avoid the need for machining operations or other modification operations on sidewall portion 12W of layer 30 (e.g., hole formation or protrusion formation that could interfere with the ability to install display 14 and layer 16 in direction 106 into the shell formed by layer 30).

If desired, the support member formed by polymer 72 may also serve as an attachment point for housing structures such as housing 12 (e.g., a rear housing wall for device 10 that is formed from ceramic, glass, metal, polymer, other materials, and/or combinations of these materials). For example, housing 12 of FIG. 7 may include a rear housing wall plate (with optional openings for optical component windows and/or other components) that is attached to the rest of device 10 by using screws or other fasteners (see, e.g., fastener 102 of FIG. 7, which is being used to mount housing 12 to a threaded screw hole opening in molded polymer 72).

Although described in connection with an illustrative configuration in which image transport layer 16 is interposed between display 14 and display cover layer 30, molded polymer of the type shown in FIG. 7 may, if desired, be used in electronic devices in which display 14 is directly overlapped by display cover layer 30 and in which image transport layer 16 is omitted. Molded polymer may be formed in one or more shots to form continuous and/or discontinuous structures.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to control the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a pixel layer configured to produce an image on a first surface and having backside contacts on an opposing second surface;
   a coherent fiber bundle that receives the image at an input surface and provides the image at an output surface;
   a component coupled to the backside contacts; and
   molded polymer coupled to the coherent fiber bundle, an edge of the pixel layer, and the component.

2. The electronic device defined in claim 1 further comprising a display cover layer having a first portion that overlaps the output surface and a second portion that forms a housing sidewall.

3. The electronic device defined in claim 2 wherein the molded polymer has an opening configured to receive a fastener.

4. The electronic device defined in claim 3 further comprising an electrical component that is attached to the molded polymer with the fastener.

5. The electronic device defined in claim 3 further comprising a housing rear wall that is attached to the molded polymer with the fastener.

6. The electronic device defined in claim 2 wherein the molded polymer has a portion molded to an inner surface of the housing sidewall.

7. The electronic device defined in claim 2 further comprising liquid adhesive in a gap between the output surface and the display cover layer.

8. The electronic device defined in claim 7 wherein a portion of the molded polymer protrudes into the gap.

9. The electronic device defined in claim 1 wherein the component comprises a component selected from the group consisting of: a printed circuit, an integrated circuit, and a connector.

10. The electronic device defined in claim 1 wherein the coherent fiber bundle has a notch and wherein the molded polymer comprises a portion in the notch.

11. The electronic device defined in claim 1 wherein the component has mating contacts that are electrically connected to the backside contacts.

12. The electronic device defined in claim 1 wherein the molded polymer is molded over the edge of the pixel layer and the component.

13. The electronic device defined in claim 12, wherein the molded polymer is molded into a notch in the coherent fiber bundle.

14. An electronic device, comprising:
a pixel layer configured to produce an image;
a coherent fiber bundle having an input surface that receives the image and having a corresponding output surface on which the image is provided;
a display cover layer that overlaps the coherent fiber bundle and that is separated by a gap from the output surface;
liquid adhesive in the gap; and
a molded polymer member coupled to the display cover layer and coupled to the coherent fiber bundle.

15. The electronic device defined in claim 14 wherein a portion of the molded polymer member protrudes into the gap.

16. The electronic device defined in claim 14 further comprising a fastener that is received within an opening in the molded polymer member.

17. The electronic device defined in claim 14 wherein the pixel layer has a bent edge that is at least partly embedded in the molded polymer member.

18. The electronic device defined in claim 14 further comprising a housing wall, wherein the molded polymer member has a portion attached to the housing wall.

19. An electronic device, comprising:
a housing;
a display in the housing that has an active area with an array of pixels configured to display an image and an inactive area without pixels at an edge of the display;
a molded polymer member that covers at least the edge of the display;
a coherent fiber bundle that receives the image at an input surface and that provides the received image to an output surface;
a glass layer that overlaps the coherent fiber bundle; and
an adhesive layer between the coherent fiber bundle and the glass layer.

* * * * *